(12) United States Patent
Rofougaran

(10) Patent No.: US 9,208,982 B2
(45) Date of Patent: Dec. 8, 2015

(54) SYSTEMS AND METHODS FOR DISTRIBUTING POWER TO INTEGRATED CIRCUIT DIES

(71) Applicant: BROADCOM CORPORATION, Irvine, CA (US)

(72) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 461 days.

(21) Appl. No.: 13/716,013

(22) Filed: Dec. 14, 2012

(65) Prior Publication Data

US 2014/0152376 A1 Jun. 5, 2014

Related U.S. Application Data

(60) Provisional application No. 61/732,870, filed on Dec. 3, 2012.

(51) Int. Cl.
*H01J 1/00* (2006.01)
*H01L 23/58* (2006.01)
*H01F 27/42* (2006.01)
*H01F 38/14* (2006.01)
*H02J 5/00* (2006.01)
*H05K 1/02* (2006.01)

(52) U.S. Cl.
CPC . *H01J 1/00* (2013.01); *H01L 23/58* (2013.01); *H01F 38/14* (2013.01); *H02J 5/005* (2013.01); *H05K 1/0262* (2013.01)

(58) Field of Classification Search
USPC .......................................................... 307/104
See application file for complete search history.

(56) References Cited

U.S. PATENT DOCUMENTS

2010/0088534 A1\* 4/2010 Watanabe et al. ............. 713/340
2011/0043050 A1\* 2/2011 Yabe et al. .................... 307/104

\* cited by examiner

*Primary Examiner* — Robert Deberadinis
(74) *Attorney, Agent, or Firm* — McDermott Will & Emery LLP

(57) ABSTRACT

Systems and methods for distributing power to a plurality of integrated circuit dies are provided. In some aspects, a system includes a substrate and a plurality of integrated circuit dies disposed on the substrate. Each of the plurality of integrated circuit dies includes a circuit and a target inductive element coupled to the circuit. The system also includes a power supply module configured to generate a source power signal. The system also includes at least one source inductive element configured to electromagnetically couple the source power signal to one or more of the plurality of the target inductive elements to generate one or more target power signals that supply power to one or more corresponding circuits.

20 Claims, 6 Drawing Sheets

SYSTEMS AND METHODS FOR DISTRIBUTING POWER TO INTEGRATED CIRCUIT DIES

CROSS-REFERENCES TO RELATED APPLICATIONS

The present application claims the benefit of U.S. Provisional Patent Application Ser. No. 61/732,870, titled "Systems and Methods for Distributing Power to Integrated Circuit Dies," filed on Dec. 3, 2012, which is hereby incorporated by reference in its entirety for all purposes.

FIELD

The subject technology generally relates to power distribution and, in particular, relates to systems and methods for distributing power to integrated circuit dies.

BACKGROUND

Electrical interconnects, such as wire bonding interconnects, may be used to couple integrated circuit (IC) dies to a printed circuit board (PCB) supporting the IC dies. Power, for example, may be distributed to the IC dies via the PCB and the electrical interconnects. An IC die having millions of transistors may typically have a size of 2 to 20 millimeters by 2 to 20 millimeters. However, as IC fabrication technology continues to advance, IC dies may become smaller and smaller with more and more transistors. In this regard, as IC dies become smaller while the size of conventional electrical interconnects remain the same, distributing power to the smaller IC dies using the conventional electrical interconnects is becoming more challenging.

BRIEF DESCRIPTION OF THE DRAWINGS

The accompanying drawings, which are included to provide further understanding of the subject technology and are incorporated in and constitute a part of this specification, illustrate aspects of the subject technology and together with the description serve to explain the principles of the subject technology.

DETAILED DESCRIPTION

In the following detailed description, numerous specific details are set forth to provide a full understanding of the subject technology. It will be apparent, however, that the subject technology may be practiced without some of these specific details. In other instances, structures and techniques have not been shown in detail so as not to obscure the subject technology.

Figure 1:
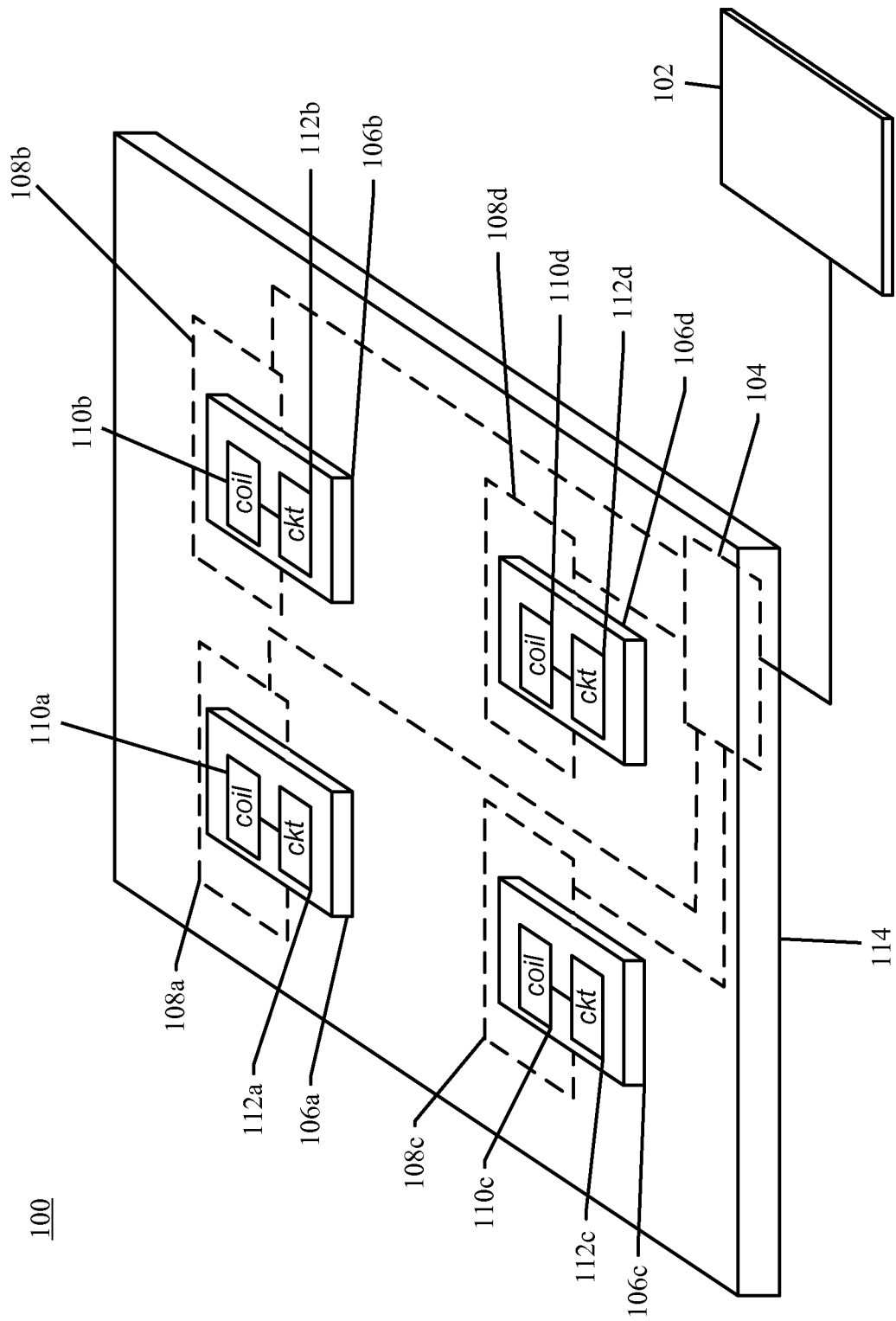
FIG. 1 illustrates an example of a system for distributing power to IC dies, in accordance with various aspects of the subject technology.

According to various aspects of the subject technology, power may be provided to a plurality of IC dies disposed on a PCB without using separate electrical interconnects. Power, for example, may be distributed wirelessly to the IC dies without requiring the use of electrical interconnects. FIG. 1 illustrates an example of system 100 for distributing power to IC dies 106a, 106b, 106c, and 106d, in accordance with various aspects of the subject technology. Each of these IC dies is disposed on substrate 114, which may be a PCB or another structure for supporting an IC die. In some aspects, each IC die includes a circuit (e.g., circuit 112a, 112b, 112c, or 112d), which can perform various types of processing for communications, calculations, and/or other purposes. Each IC dies also includes a target inductive element (e.g., target inductive element 110a, 110b, 110c, or 110d) coupled to a corresponding circuit. In one or more implementations, each target inductive element may be a coil. Substrate 114 includes source inductive elements (e.g., source inductive elements 108a, 108b, 108c, and 108d) that each electromagnetically couples a source power signal to a corresponding target inductive element (e.g., source inductive element 108a electromagnetically couples a source power signal to target inductive element 110a, source inductive element 108b electromagnetically couples a source power signal to target inductive element 110b, source inductive element 108c electromagnetically couples a source power signal to target inductive element 110c, source inductive element 108d electromagnetically couples a source power signal to target inductive element 110d). Based on the electromagnetically coupled source power signal, each target inductive element may generate a target power signal that can be used to supply power to a corresponding circuit. In one or more implementations, each source inductive element may be a coil. The source inductive elements are drawn in FIG. 1 with dotted lines to illustrate that they are within substrate 114. However, according to certain aspects, it is understood that the source inductive elements may be positioned in other areas, such as on top of substrate 114.

Power supply module 102 may generate the source power signal that the source inductive elements electromagnetically couple to the target inductive elements. In one or more implementations, this power signal may be an alternating current (AC) signal. Power supply module 102 may include a digital-to-analog converter (DAC) with an oscillator that receives a direct current (DC) signal from a DC power supply and converts the DC signal into the AC signal (e.g., the source power signal), which allows the source inductive elements to electromagnetically couple this signal to the target inductive elements, which in turn may generate corresponding target power signals. The target power signals may also be AC signals. According to certain aspects, each circuit may include a rectifier configured to convert the target power signals into DC signals.

According to certain aspects, substrate 114 includes switch module 104 that selects a set of IC dies to direct the source power signal to. In particular, switch module 104 directs the source power signal to the source inductive elements corresponding to the selected set of IC dies. In this regard, the source inductive elements that received the source power signal may electromagnetically couple the source power signal to corresponding ones of the target inductive elements, which may generate corresponding target power signals that supply power to corresponding circuits. For example, if switch module 104 selects IC dies 106a and 106b to direct the source power signal to, switch module 104 may direct the source power signal received from power supply module 102 to source inductive elements 108a and 108b (but not source inductive elements 108c and 108d). Source inductive element 108a may electromagnetically couple the source power signal to target inductive element 110a, thereby allowing target inductive element 110a to generate a target power signal that supplies power to circuit 112a. Similarly, source inductive element 108b may electromagnetically couple the source power signal to target inductive element 110b, thereby allowing target inductive element 110b to generate a target power signal that supplies power to circuit 112b.

According to certain aspects, switch module 104 may include one or more microelectromechanical systems (MEMS) switches (e.g., liquid MEMS switches), silicon switches, multiplexers, and/or other suitable components for directing the source power signal to selected areas. According to certain aspects, the DAC may form a part of switch module 104 rather than power supply module 102. Switch module 104 is also drawn in FIG. 1 with dotted lines to illustrate that it is within substrate 114. However, according to certain aspects, it is understood that switch module 104 may be positioned in other areas, such as on top of substrate 114.

Figure 2:
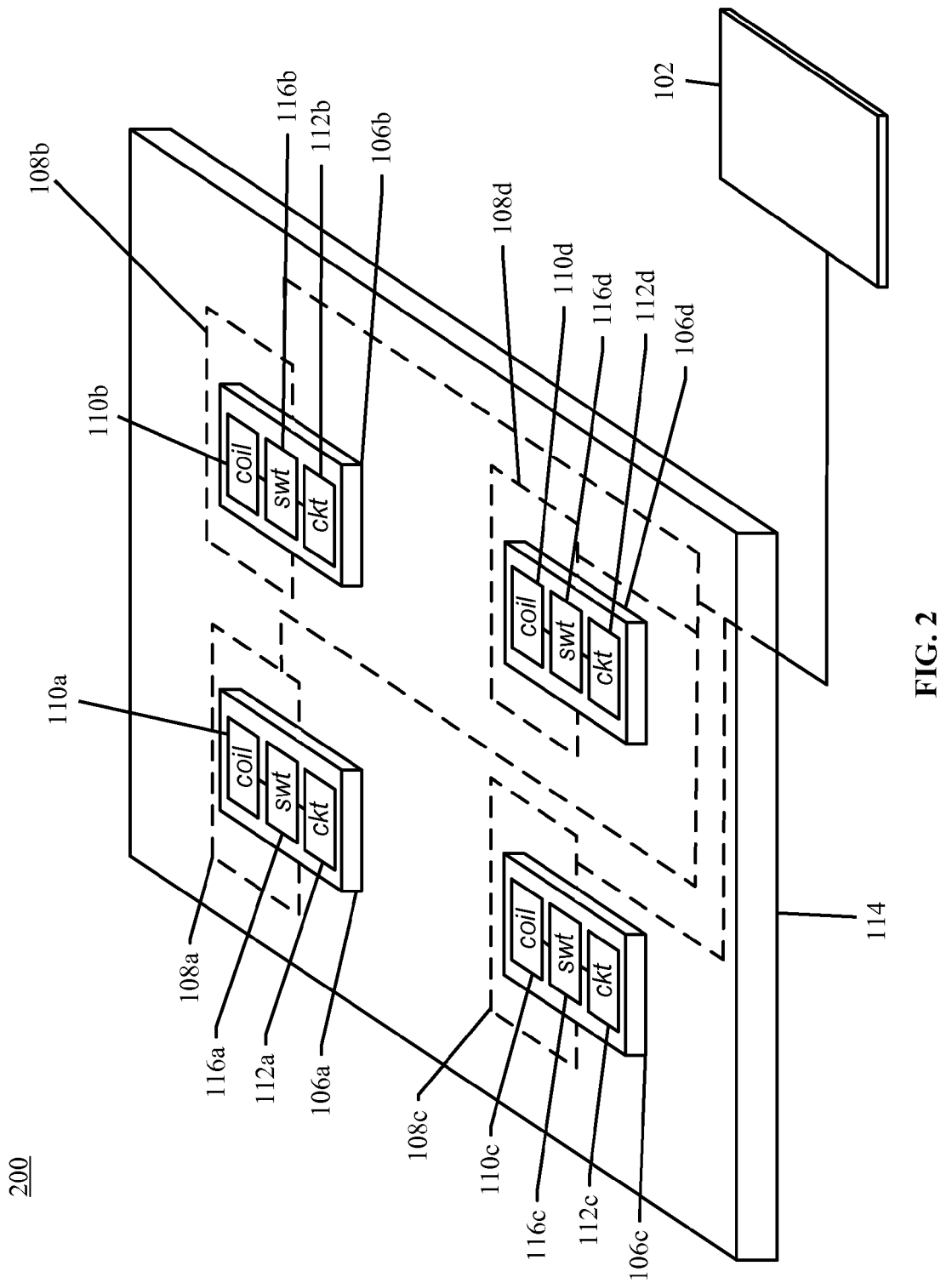
FIG. 2 illustrates an example of a system for distributing power to IC dies, in accordance with various aspects of the subject technology.

In some aspects, the switching implemented by switch module 104 (e.g., to direct the source power signal to selected ones of the IC dies) may be implemented in other areas within substrate 114 and/or within an IC die. FIG. 2 illustrates an example of system 200 for distributing power to IC dies 106a, 106b, 106c, and 106d, in accordance with various aspects of the subject technology. System 200 is similar to system 100, except that system 200 does not include switch module 104. Rather, each IC die (e.g., IC die 106a, 106b, 106c, or 106d) includes a respective switch (e.g., switch 116a, 116b, 116c, or 116d). Each of these switches may select a corresponding circuit (e.g., circuit 112a, 112b, 112c, or 112d) to provide power to. In one or more implementations, power supply module 102 generates the source power signal and provides the source power signal to the source inductive elements (e.g., source inductive elements 108a, 108b, 108c, and 108d). The source inductive elements may electromagnetically couple the source power signal to the corresponding target inductive elements (e.g., target inductive elements 110a, 110b, 110c, and 110d), each of which may generate a target power signal. If a switch (e.g. switch 116a, 116b, 116c, or 116d) is set to select a corresponding circuit (e.g. circuit 112a, 112b, 112c, or 112d), then a corresponding target power signal may be delivered to this circuit.

Although system 200 is shown in FIG. 2 as having only four IC dies, each with a corresponding target inductive element, circuit, switch, and source inductive element, it is understood that system 200 can include any number of IC dies, target inductive elements, circuits, switches, or source inductive elements. Similarly, although system 100 is shown in FIG. 1 as having only four IC dies, each with a corresponding target inductive element, circuit, and source inductive element, it is understood that system 100 can include any number of IC dies, target inductive elements, circuits, or source inductive elements.

Figure 3:
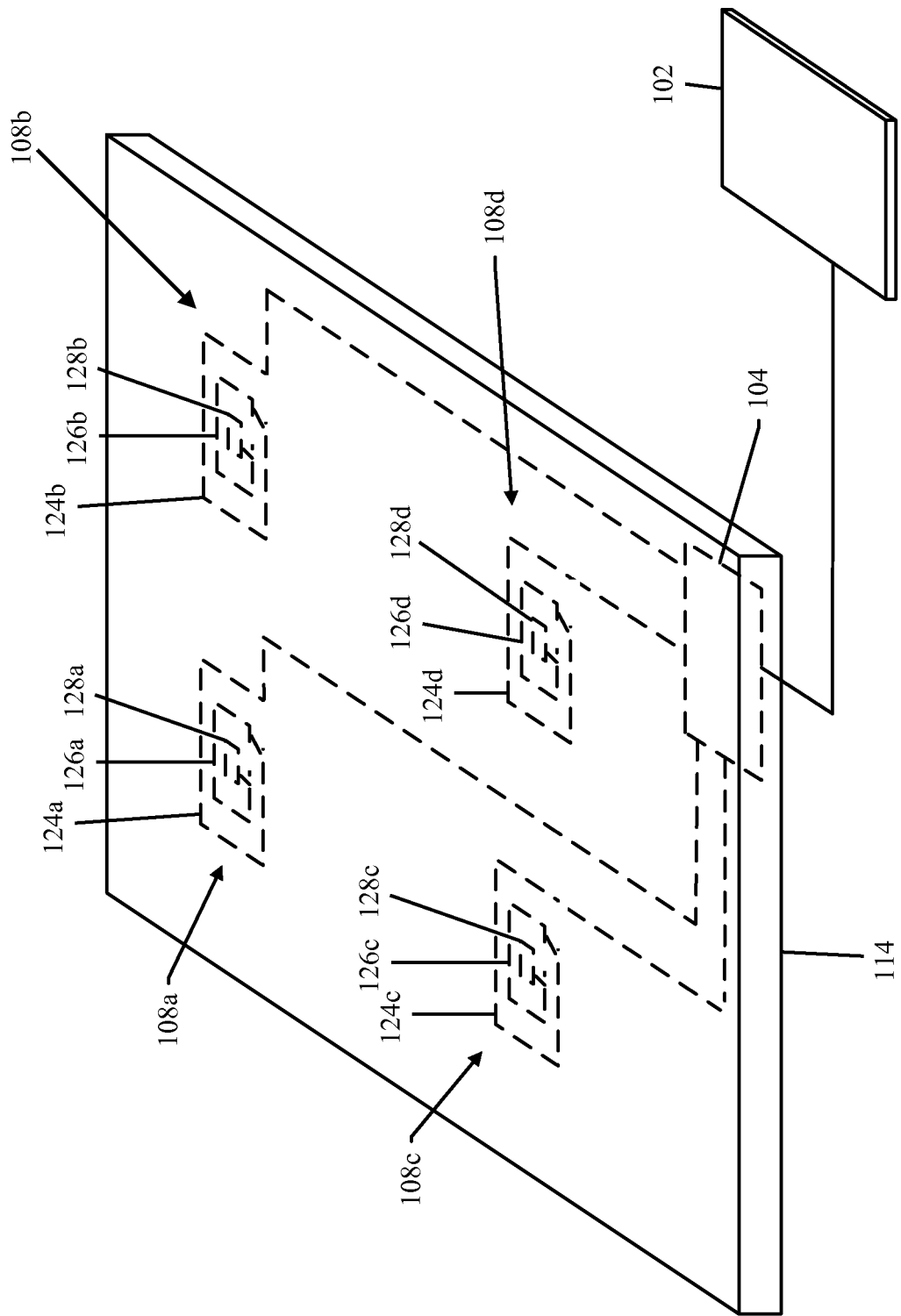
FIG. 3 illustrates an example of a substrate with IC dies removed so as not to obscure details of source inductive elements, in accordance with various aspects of the subject technology.

FIG. 3 illustrates substrate 114 (e.g., of system 100 in FIG. 1) with IC dies 106a, 106b, 106c, and 106d removed so as not to obscure details of source inductive elements 108a, 108b, 108c, and 108d, in accordance with various aspects of the subject technology. As shown in FIG. 3, each source inductive element forms a shape having an outer loop (e.g., outer loop 124a, 124b, 124c, or 124d), a middle loop (e.g., 126a, 126b, 126c, or 126d), and an inner loop (e.g., 128a, 128b, 128c, or 128d). According to certain aspects, each target inductive element (e.g., target inductive element 110a, 110b, 110c, or 110d in FIG. 1) may have substantially the same shape as a corresponding source inductive element. In one or more implementations, each source inductive element may be aligned with a corresponding target inductive element in order to maximize power transfer from a source inductive element to a corresponding target inductive element. Although the source inductive elements and the target inductive elements are described as forming a shape with an outer loop, a middle loop, and an inner loop, it is understood that these inductive elements may form any shape (e.g., circular, rectangular, polygonal, etc.).

Figure 4:
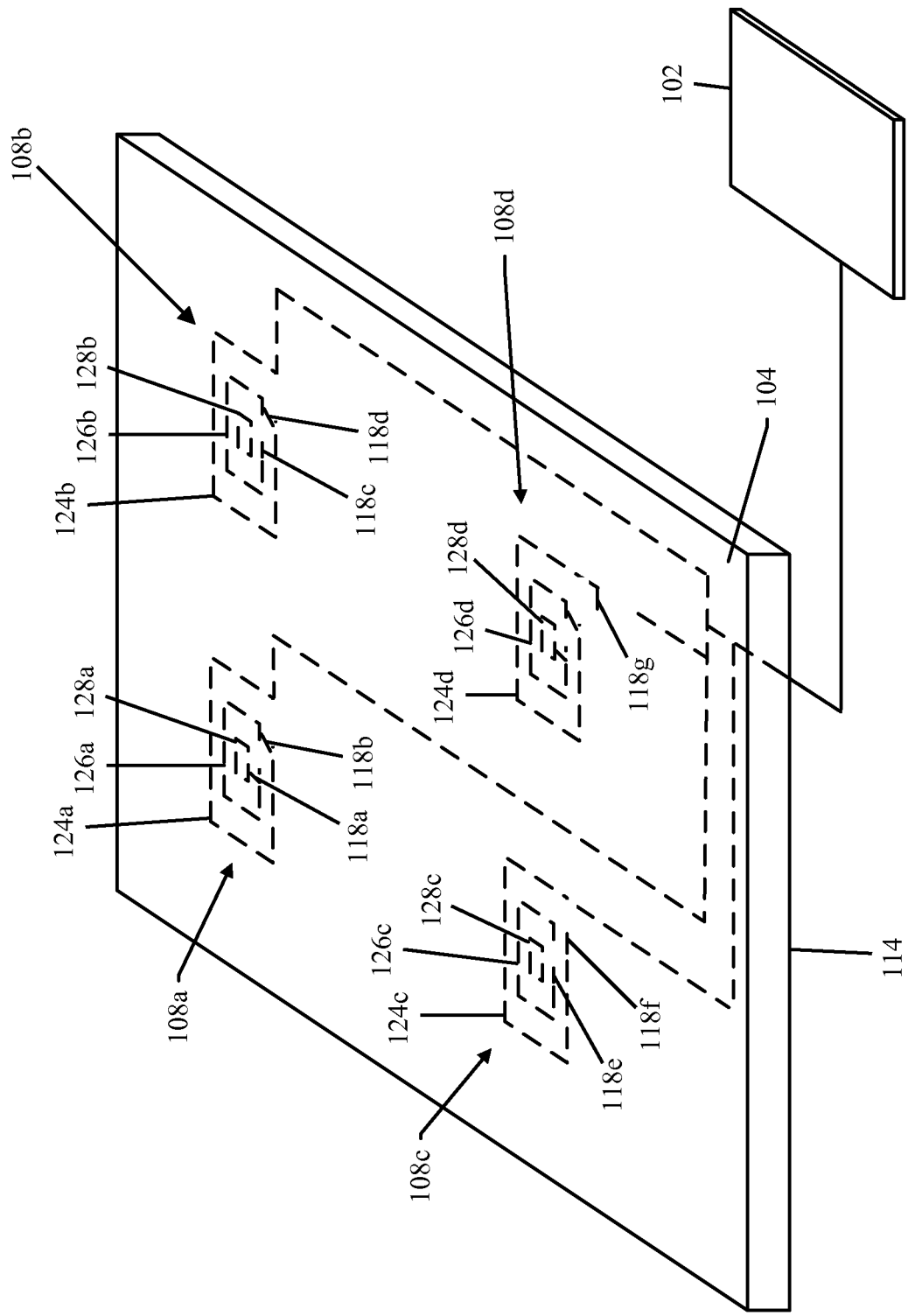
FIG. 4 illustrates an example of source inductive elements including respective switches that direct the source power signal to corresponding IC dies, in accordance with various aspects of the subject technology.

Although FIG. 3 illustrates switching module 104 as directing the source power signal to the source inductive elements, the switching implemented by switch module 104 may be implemented in other areas within substrate 114. In one or more implementations, the source inductive elements themselves may include switches that perform the switching (e.g., to direct the source power signal to selected ones of the IC dies). FIG. 4 illustrates an example of source inductive elements (e.g., source inductive elements 108a, 108b, 108c, and 108d) including respective switches that direct the source power signal to corresponding IC dies, in accordance with various aspects of the subject technology. In one or more implementations, system 100 in FIG. 1 may include the switches in FIG. 4 rather than switch module 104 to implement the switching (e.g., to direct the source power signal to selected ones of the IC dies). Similar to FIG. 3, IC dies 106a, 106b, 106c, and 106d (e.g., as shown in FIG. 1) are removed in FIG. 4 so as not to obscure details of source inductive elements 108a, 108b, 108c, and 108d, and their respective switches.

As shown in FIG. 4, each source inductive element includes one or more switches that when closed, may allow the source power signal to be electromagnetically coupled to a corresponding target inductive element (not shown). In some aspects, a source inductive element that includes one or more switches allows the source power signal to be provided to only a portion of the source inductive element rather than the entire source inductive element. The benefit of having one or more switches form a part of a source inductive element itself is that the source inductive element may be configured into different shapes depending on which switches are open or closed. A source inductive element may be configured into a shape that maximizes power transfer to a corresponding target inductive element. For example, source inductive element 108a includes switches 118a and 118b. When switch 118a is closed, a connection is formed between inner loop 128a and middle loop 126a. When switch 118a is open, these loops are not connected. When switch 118b is closed, a connection is formed between middle loop 126a and outer loop 124a. When switch 118b is open, these loops are not connected. As shown in FIG. 4, switches 118a and 118b are both closed, thereby allowing source inductive element 108a to form the three-loop shape as described in FIG. 3.

Similarly, source inductive element 108b includes switches 118c and 118d. When switch 118c is closed, a connection is formed between inner loop 128b and middle loop 126b. When switch 118c is open, these loops are not connected. When switch 118d is closed, a connection is formed between middle loop 126b and outer loop 124b. When switch 118d is open, these loops are not connected. As shown in FIG. 4, switch 118c is open while switch 118d is closed. Thus, source inductive element 108b forms a shape with just outer loop 124b and middle loop 126b.

Similarly, source inductive element 108c includes switches 118e and 118f. When switch 118e is closed, a connection is formed between inner loop 128c and middle loop 126c. When switch 118e is open, these loops are not connected. When switch 118f is closed, a connection is formed between middle loop 126c and outer loop 124c. When switch 118d is open, these loops are not connected. As shown in FIG. 4, both switches 118e and 118f are open. Thus, source inductive element 108c forms a shape with just outer loop 124c.

Source inductive element 108d includes switch 118g. When switch 118g is closed, the source power signal may be delivered to outer loop 124d, middle loop 126d, and inner loop 128d of source inductive element 108d. When switch 118g is open, the source power signal is not delivered to source inductive element 108d. As shown in FIG. 4, switch 118g is open. Thus, the source power signal is not electromagnetically coupled to the corresponding target inductive element (e.g., target inductive element 110d in FIG. 1).

A source inductive element may include any number of switches that, depending on whether the switches are closed or open, may change a shape of the source inductive element. According to certain aspects, the switches of a source inductive element may be configured (e.g., either as closed or open) to form a shape for the source inductive element that matches and/or aligns with a shape of one or more target inductive elements, thereby allowing power transfer between the source inductive element and the one or more target inductive elements to be maximized. In some aspects, similar to the source inductive element, a target inductive element may include one or more switches that, depending on whether the switches are closed or open, may change a shape of the target inductive element.

Depending on which IC dies are selected, the switching described herein (e.g., with respect to FIGS. 1, 2, and 4) may result in a change in an impedance encountered by a source inductive element (e.g., an impedance in a direction of power supply module 102 that the source inductive element "sees"). This impedance may be referred to as a source impedance. The switching may also result in a change in an impedance encountered by a target inductive element (e.g., an impedance in a direction of a corresponding circuit that the target inductive element "sees"). This impedance may be referred to as a target impedance. In order to maximize power transfer between a source inductive element and a corresponding target inductive element, it may be beneficial to match the source impedance to the target impedance. According to various aspects of the subject technology, a tuner may be used to match the source impedance to the target impedance in order to maximize power transfer.

Figure 5:
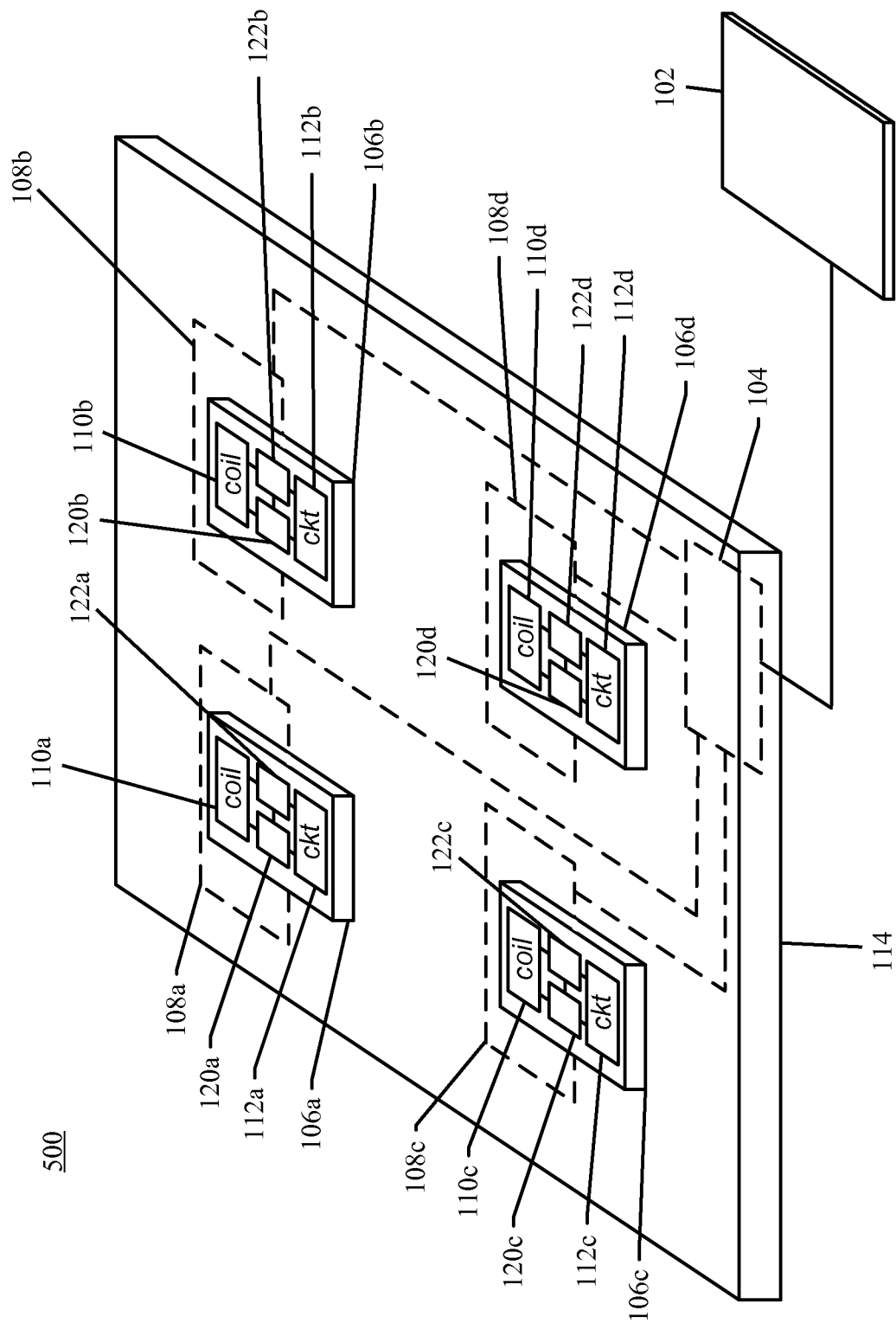
FIG. 5 illustrates an example of a system for distributing power to IC dies, in accordance with various aspects of the subject technology.

FIG. 5 illustrates an example of system 500 for distributing power to IC dies 106a, 106b, 106c, and 106d, in accordance with various aspects of the subject technology. System 500 is similar to system 100, except that IC dies 106a, 106b, 106c, and 106d of system 500 each includes a detector (e.g., detector 120a, 120b, 120c, or 120d) and a tuner (e.g., tuner 122a, 122b, 122c, or 122d). According to certain aspects, the detector may measure a parameter that includes a target impedance encountered by a corresponding target inductive element (e.g., target inductive element 110a, 110b, 110c, or 110d), a source impedance encountered by a corresponding source inductive element (e.g., source inductive element 108a, 108b, 108c, or 108d), a frequency of the source power signal, a frequency of a corresponding target power signal, a magnitude of the source power signal (e.g., current amplitude), a magnitude of a corresponding target power signal (e.g., current amplitude), a voltage across a source inductive element (e.g., referred to as a source voltage), a voltage across a corresponding target inductive element (e.g., referred to as a target voltage), and/or another element that can be used to maximize the power transfer between a source inductive element and a target inductive element.

According to certain aspects, depending on the parameter that the detector measured, the tuner may adjust the parameter in order to maximize power transfer between the source inductive element and the target inductive element. In one or more implementations, the tuner may adjust the source impedance and/or the target impedance so that these impedances match one another. In some aspects, the tuner may adjust the frequency of the source power signal and/or the frequency of the one or more target power signals so that the frequencies match one another (e.g., matching resonant frequencies). In some aspects, the tuner may adjust the current of the source power signal, the current of a corresponding target power signal, the voltage across a source inductive element, and/or the voltage across a corresponding target inductive element to maximize the power that is transferred from the source inductive element to the target inductive element. In one or more implementations, the tuner may include an inductor (e.g., variable inductor), a capacitor (e.g., a variable capacitor), a resonant circuit, a switch (e.g., a switch described with respect to FIG. 3 or one that selects a number of windings of the source inductive element and/or target inductive element that produces a transformer ratio that maximizes power transfer), a phase-locked loop (e.g., for locking to a resonant frequency), and/or other components for adjusting the parameter in order to maximize power transfer. Although the tuner and the detector are illustrated in FIG. 5 as being implemented as part of a corresponding IC die, it is understood that the tuner and/or the detector may be implemented in other areas, such as part of substrate 114.

Figure 6:
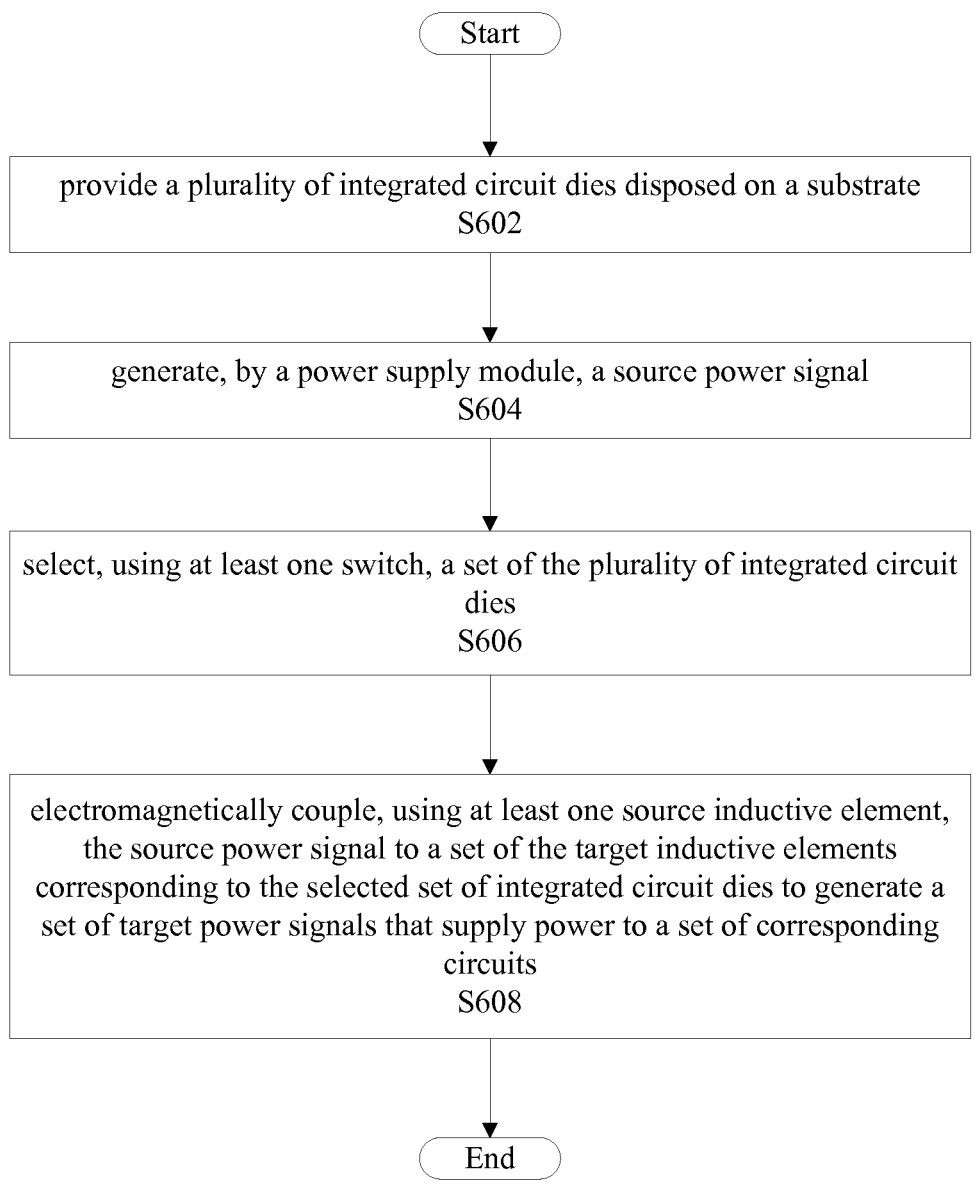
FIG. 6 illustrates an example of a method for distributing power to a plurality of integrated circuit dies, in accordance with various aspects of the subject technology.

FIG. 6 illustrates an example of method 600 for distributing power to a plurality of integrated circuit dies, in accordance with various aspects of the subject technology. Method 600 includes providing a plurality of integrated circuit dies disposed on a substrate (S602). Each of the plurality of integrated circuit dies includes a circuit and a target inductive element coupled to the circuit. Method 600 also includes generating, by a power supply module, a source power signal (S604) and selecting, using at least one switch, a set of the plurality of integrated circuit dies (S606). Method 600 also includes electromagnetically coupling, using at least one source inductive element, the source power signal to a set of the target inductive elements corresponding to the selected set of integrated circuit dies to generate a set of target power signals that supply power to a set of corresponding circuits (S608).

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used herein, the phrase "at least one of" preceding a series of items, with the term "and" or "or" to separate any of the items, modifies the list as a whole, rather than each member of the list (i.e., each item). The phrase "at least one of"

does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to analyze and control an operation or a component may also mean the processor being programmed to analyze and control the operation or the processor being operable to analyze and control the operation. Likewise, a processor configured to execute code can be construed as a processor programmed to execute code or operable to execute code.

Terms such as "top," "bottom," "front," "rear" and the like as used in this disclosure, if any, should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A system for distributing power to a plurality of integrated circuit dies, the system comprising:
    a substrate;
    a plurality of integrated circuit dies disposed on the substrate, wherein each of the plurality of integrated circuit dies comprises a circuit and a target inductive element coupled to the circuit;
    a power supply circuit configured to generate a source power signal; and
    at least one source inductive element configured to selectively electromagnetically couple the source power signal to one or more of the plurality of the target inductive elements to generate one or more target power signals that supply power to one or more corresponding circuits.

2. The system of claim 1, wherein the substrate comprises the at least one source inductive element.

3. The system of claim 1, further comprising at least one switch configured to select a set of the plurality of integrated circuit dies, wherein the at least one source inductive element is configured to electromagnetically couple the source power signal to a set of target inductive elements corresponding to the selected set of integrated circuit dies to generate one or more corresponding target power signals that supply power to a set of corresponding circuits.

4. The system of claim 3, wherein the substrate comprises the at least one switch.

5. The system of claim 3, wherein the set of integrated circuit dies each comprises a respective one of the at least one switch.

6. The system of claim 3, wherein the at least one source inductive element comprises the at least one switch.

7. The system of claim 3, wherein the at least one switch is configured to select the set of integrated circuit dies such that alignment between the at least one source inductive element and the set of corresponding target inductive elements is maximized.

8. The system of claim 1, further comprising at least one detector configured to measure a parameter, the parameter comprising at least one of a target impedance encountered by the one or more target inductive elements, a source impedance encountered by the at least one source inductive element, a frequency of the source power signal, a frequency of the one or more target power signals, a magnitude of the source power signal, a magnitude of the one or more target power signals, a source voltage across the at least one source inductive element, and a target voltage across the one or more target inductive elements.

9. The system of claim 8, further comprising at least one tuner coupled to the at least one detector, the at least one tuner configured to adjust the parameter such that the power supplied to the one or more circuits is maximized.

10. The system of claim 9, wherein the at least one tuner is configured to (a) match the source impedance to the target impedance, and/or (b) match the frequency of the source power signal to the frequency of the one or more target power signals.

11. The system of claim 9, wherein each of the at least one tuner comprises at least one of a phase-locked loop, an inductor, a capacitor, and a tuning switch.

12. A method for distributing power to a plurality of integrated circuit dies, the method comprising:
   providing a plurality of integrated circuit dies disposed on a substrate, wherein each of the plurality of integrated circuit dies comprises a circuit and a target inductive element coupled to the circuit;
   generating, by a power supply circuit, a source power signal; and
   selectively electromagnetically coupling, using at least one source inductive element, the source power signal to a set of the plurality of the target inductive elements to generate one or more target power signals that supply power to a set of corresponding circuits.

13. The method of claim 12, further comprising selecting, using at least one switch, a set of the plurality of integrated circuit dies that comprise the set of corresponding circuits.

14. The method of claim 12, wherein the source power signal comprises an alternating current signal.

15. The method of claim 12, further comprising measuring, using at least one detector, a parameter, the parameter comprising at least one of a target impedance encountered by the one or more target inductive elements, a source impedance encountered by the at least one source inductive element, a frequency of the source power signal, a frequency of the one or more target power signals, a magnitude of the source power signal, a magnitude of the one or more target power signals, a source voltage across the at least one source inductive element, and a target voltage across the one or more target inductive elements.

16. The method of claim 15, further comprising adjusting, using at least one tuner coupled to the at least one detector, the parameter such that the power supplied to the one or more circuits is maximized.

17. A system for distributing power to a plurality of integrated circuit dies, the system comprising:
   a substrate comprising at least one source inductive element;
   a plurality of integrated circuit dies disposed on the substrate, wherein each of the plurality of integrated circuit dies comprises a circuit and a target inductive element coupled to the circuit;
   a power supply circuit configured to generate a source power signal; and
   at least one switch configured to select a set of the plurality of integrated circuit dies,
   wherein the at least one source inductive element is configured to electromagnetically couple the source power signal to a set of target inductive elements corresponding to the selected set of integrated circuit dies to generate one or more target power signals that supply power to a set of corresponding circuits.

18. The system of claim 17, further comprising at least one detector configured to measure a parameter, the parameter comprising at least one of a target impedance encountered by the set of target inductive elements, a source impedance encountered by the at least one source inductive element, a frequency of the source power signal, a frequency of the one or more target power signals, a magnitude of the source power signal, a magnitude of the one or more target power signals, a source voltage across the at least one source inductive element, and a target voltage across the set of target inductive elements.

19. The system of claim 18, further comprising at least one tuner coupled to the at least one detector, the at least one tuner configured to adjust the parameter such that the power supplied to the one or more circuits is maximized.

20. The system of claim 18, wherein the at least one switch is configured to select the set of integrated circuit dies based on the measured parameter such that the power supplied to the one or more circuits is maximized.

* * * * *